(12) United States Patent
Hsu et al.

(10) Patent No.: US 10,340,235 B2
(45) Date of Patent: Jul. 2, 2019

(54) SEMICONDUCTOR PACKAGE WITH THREE-DIMENSIONAL ANTENNA

(71) Applicant: MEDIATEK INC., Hsin-Chu (TW)

(72) Inventors: Chih-Chun Hsu, New Taipei (TW); Sheng-Mou Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/841,667

(22) Filed: Dec. 14, 2017

(65) Prior Publication Data
US 2018/0108624 A1 Apr. 19, 2018

Related U.S. Application Data

(63) Continuation of application No. 15/335,226, filed on Oct. 26, 2016, now Pat. No. 9,881,882.

(60) Provisional application No. 62/275,280, filed on Jan. 6, 2016.

(51) Int. Cl.
| | | |
|---|---|---|
| *H01L 27/08* | (2006.01) | |
| *H01L 23/66* | (2006.01) | |
| *H01L 23/31* | (2006.01) | |
| *H01L 23/552* | (2006.01) | |
| *H01L 23/00* | (2006.01) | |

(52) U.S. Cl.
CPC .......... *H01L 23/66* (2013.01); *H01L 23/3128* (2013.01); *H01L 23/552* (2013.01); *H01L 24/13* (2013.01); *H01L 24/16* (2013.01); *H01L 2223/6677* (2013.01); *H01L 2224/131* (2013.01); *H01L 2224/13147* (2013.01); *H01L 2224/16227* (2013.01); *H01L 2924/1421* (2013.01); *H01L 2924/15311* (2013.01); *H01L 2924/3025* (2013.01)

(58) Field of Classification Search
CPC ... H01L 23/66; H01L 23/552; H01L 23/3128; H01L 2223/6677; H01L 2924/3025; H01L 25/105; H01L 23/60
USPC .......................................................... 257/531
See application file for complete search history.

(56) References Cited

U.S. PATENT DOCUMENTS

| | | |
|---|---|---|
| 6,686,649 B1 | 2/2004 | Matthews et al. |
| 8,199,518 B1 | 6/2012 | Chun et al. |
| 8,278,749 B2 * | 10/2012 | Lachner ............... H01Q 1/2283 257/693 |
| 9,007,273 B2 | 4/2015 | Liao et al. |
| 9,093,740 B2 | 7/2015 | Barratt et al. |
| 9,265,032 B2 * | 2/2016 | Rofougaran ...... H04L 12/40013 |

(Continued)

FOREIGN PATENT DOCUMENTS

| | | |
|---|---|---|
| CN | 101017833 A | 8/2007 |
| TW | 201436361 A | 9/2014 |

*Primary Examiner* — Caleb E Henry
(74) *Attorney, Agent, or Firm* — McClure, Qualey & Rodack, LLP

(57) ABSTRACT

A semiconductor package is provided. The semiconductor package includes a package substrate having a first region and a second region defined between an edge of the package substrate and an edge of the first region, a semiconductor die disposed on the package substrate in the first region, a conductive shielding element disposed on the package substrate and covering the semiconductor die, and a three-dimensional (3D) antenna. The 3D antenna includes a planar structure portion disposed on the package substrate in the second region, and a bridge structure portion above the planar structure portion and connected thereto.

18 Claims, 8 Drawing Sheets

(56) References Cited

U.S. PATENT DOCUMENTS

| | | |
|---|---|---|
| 9,881,882 B2 * | 1/2018 | Hsu .................. H01L 23/66 |
| 2007/0187820 A1 | 8/2007 | Takano et al. |
| 2012/0062439 A1 | 3/2012 | Liao |
| 2012/0295539 A1 * | 11/2012 | McCormack ........ H04B 5/0031 |
| | | 455/39 |
| 2012/0302290 A1 | 11/2012 | Tsai et al. |
| 2013/0225102 A1 | 8/2013 | Tsutsumi et al. |
| 2014/0247195 A1 | 9/2014 | Yen |
| 2014/0252595 A1 * | 9/2014 | Yen .................. H01L 23/498 |
| | | 257/737 |
| 2015/0262931 A1 * | 9/2015 | Vincent ............. H01L 21/76838 |
| | | 257/773 |
| 2015/0295305 A1 * | 10/2015 | Herbsommer ....... H01Q 19/108 |
| | | 343/873 |
| 2015/0302290 A1 | 10/2015 | Saito |
| 2017/0077039 A1 * | 3/2017 | Liao .................. H01L 23/552 |

* cited by examiner

SEMICONDUCTOR PACKAGE WITH THREE-DIMENSIONAL ANTENNA

CROSS REFERENCE TO RELATED APPLICATIONS

This application is a Continuation of U.S. patent application Ser. No. 15/335,226, filed on Oct. 26, 2016, now U.S. Pat. No. 9,881,882, which claims the benefit of U.S. Provisional Application No. 62/275,280 filed on Jan. 6, 2016, the entirety of which is incorporated by reference herein.

BACKGROUND OF THE INVENTION

Field of the Invention

The present invention relates to semiconductor package technology, and in particular to a semiconductor package with a three-dimensional (3D) antenna.

Description of the Related Art

In recent years, the semiconductor industry has seen a trend towards the so-called system in package (SiP) concept. The integration of systems integrated into a single integrated circuit (IC) package provides several advantages in terms of cost, size, performance, and product-design flexibility.

Many handheld electronic products, such as handheld computers, mobile phones, personal digital assistants (PDAs), and digital cameras, or media players, often include SiP components. These handheld electronic products are also provided with wireless communications capabilities. For achieving the function of wireless communications, an antenna and a communication module (e.g., an IC package with radio frequency (RF) devices) are typically required. The antenna is used for transmitting and receiving signals from the communication module.

In the conventional design of an IC package (e.g., the communication module), the antenna is not incorporated therein. Namely, the antenna and the IC package are manufactured separately and are electrically connected after being mounted on a circuit board. As a result, the manufacturing cost is increased and it is difficult to achieve a compact and small SiP component.

Although the incorporation of an antenna into a typical IC package has been proposed, electromagnetic interference (EMI) and signal coupling between the antenna and different parts of the chip or package may easily occur. These can result in a reduction of the antenna's level of performance. Thus, a novel semiconductor package is desirable.

BRIEF SUMMARY OF THE INVENTION

Semiconductor packages are provided. An exemplary embodiment of a semiconductor package includes a package substrate having a first region and a second region defined between an edge of the package substrate and an edge of the first region. A semiconductor die is disposed on the package substrate in the first region. A conductive shielding element is disposed on the package substrate and covers the semiconductor die. A 3D antenna includes a planar structure portion disposed on the package substrate in the second region. The 3D antenna further includes a bridge structure portion above the planar structure portion and connected thereto. A molding compound encapsulates the conductive shielding element and the 3D antenna.

Another exemplary embodiment of a semiconductor package includes a package substrate having a first region and a second region defined between an edge of the package substrate and an edge of the first region. A molding compound is disposed on the package substrate in the first and second regions. A semiconductor die is disposed on the package substrate in the first region and inside the molding compound. A 3D antenna includes a planar structure portion on the package substrate in the second region. The 3D antenna further includes a wall structure portion contacting the planar structure portion and covering a top surface or one of sidewalls of the molding compound in the second region. A conductive shielding element includes a spacer portion between the 3D antenna and the semiconductor die and passing through the molding compound. The conductive shielding element further includes a U-shaped wall portion covering the sidewalls of the molding compound in the first region and separated from the wall structure portion of the 3D antenna.

An exemplary embodiment of a semiconductor package assembly includes a printed circuit board (PCB) having a keep-out region. A package substrate is disposed on the PCB. The semiconductor package includes a package substrate having a first region and a second region defined between an edge of the package substrate and an edge of the first region. A semiconductor die is disposed on the package substrate in the first region. A conductive shielding element is disposed on the package substrate and covers the semiconductor die. A 3D antenna includes a planar structure portion disposed on the package substrate in the second region. The 3D antenna further includes a bridge structure portion above the planar structure portion and connected thereto. A molding compound encapsulates the conductive shielding element and the 3D antenna.

Another exemplary embodiment of a semiconductor package assembly includes a PCB having a keep-out region. A package substrate is disposed on the PCB. The semiconductor package includes a package substrate having a first region and a second region defined between an edge of the package substrate and an edge of the first region. A molding compound is disposed on the package substrate in the first and second regions. A semiconductor die is disposed on the package substrate in the first region and inside the molding compound. A 3D antenna includes a planar structure portion on the package substrate in the second region. The 3D antenna further includes a wall structure portion contacting the planar structure portion and covering a top surface or one of sidewalls of the molding compound in the second region. A conductive shielding element includes a spacer portion between the 3D antenna and the semiconductor die and passing through the molding compound. The conductive shielding element further includes a U-shaped wall portion covering the sidewalls of the molding compound in the first region and separated from the wall structure portion of the 3D antenna.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
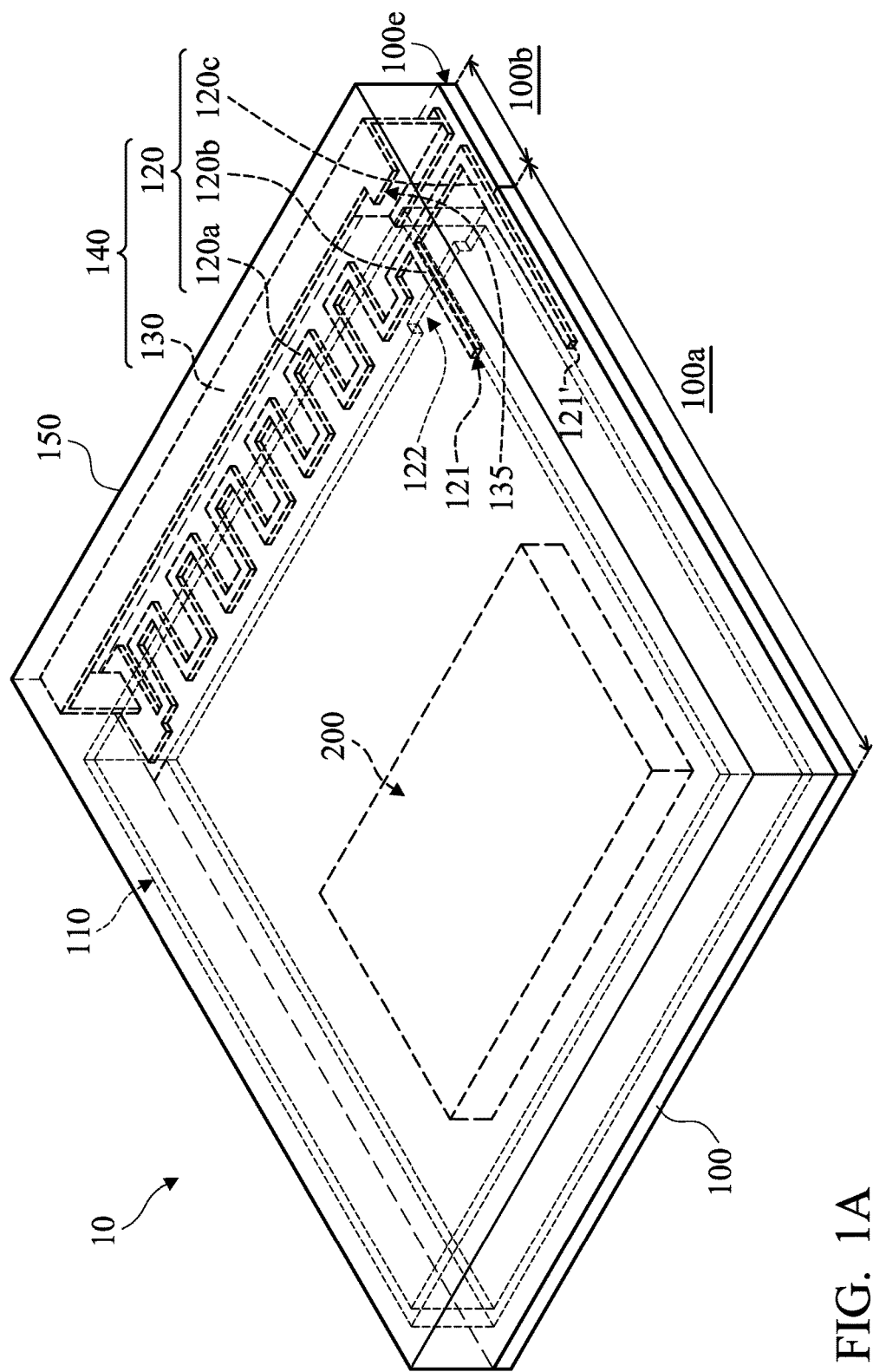
FIG. 1A is a perspective view of an exemplary semiconductor package in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The described drawings are only schematic and are non-limiting. In the drawings, the size of some of the elements may be exaggerated for illustrative purposes and are not drawn to scale. The dimensions and the relative dimensions do not correspond to actual dimensions in the practice of the invention.

Figure 1B:
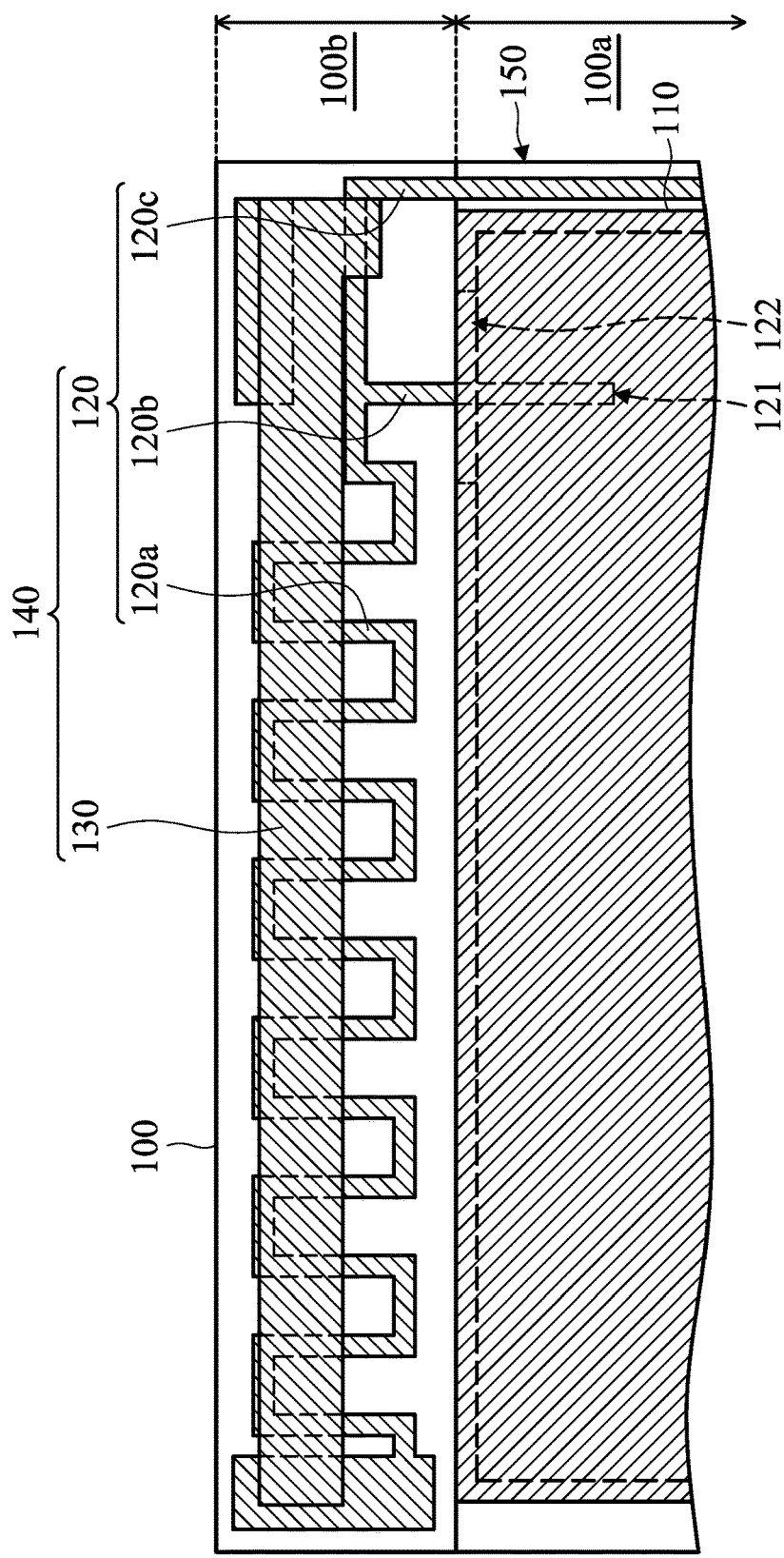
FIG. 1B is a partial plan view of the exemplary semiconductor package shown in FIG. 1A.
Figure 1C:
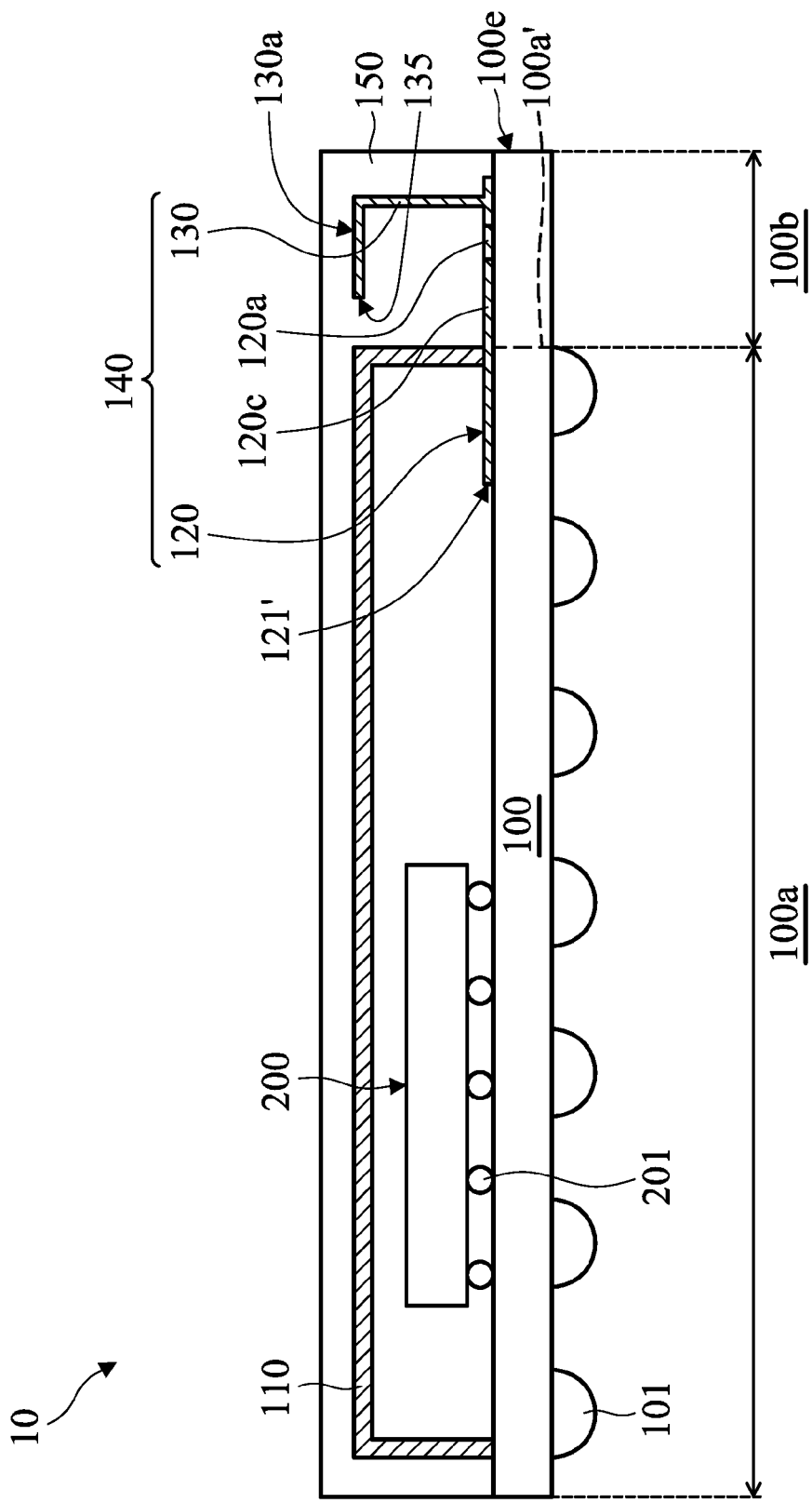
FIG. 1C is a cross-sectional view of an exemplary semiconductor package shown in FIG. 1A.

Refer to FIGS. 1A to 1C, in which FIG. 1A is a perspective view of a semiconductor package 10 in accordance with some embodiments of the disclosure, FIG. 1B is a partial plan view of the exemplary semiconductor package shown in FIG. 1A, and FIG. 1C is a cross-sectional view of an exemplary semiconductor package shown in FIG. 1A. In some embodiments, the semiconductor package 10 is a flip-chip semiconductor package. For example, the semiconductor package 10 may be a system in package (SiP) package with an integrated antenna, such as an antenna on package (AoP) or antenna in package (AiP).

In the embodiment, the semiconductor package 10 includes a package substrate 100 having a first region 100a and a second region 100b, as shown in FIG. 1C. The second region 100b is defined between an edge 100e of the package substrate 100 and an edge of the first region 100a' and has an area that is smaller than that of the first region 100a. In some embodiments, the package substrate 100 may be mounted on a base (not shown), such as a PCB, by a bonding process. For example, the package substrate 100 includes conductive structures 101 that are mounted on and electrically coupled to the base in the bonding process. In some embodiments, the conductive structures 101 include a conductive bump structure (such as a copper or solder bump structure), a conductive pillar structure, a conductive wire structure or a conductive paste structure.

In the embodiment, the semiconductor package 10 further includes a semiconductor die 200 disposed on the package substrate 100 in the first region 100a. In some embodiments, the semiconductor die 200 may be mounted on the package substrate 100 by a bonding process. For example, the semiconductor die 200 includes conductive structures 201 that are mounted on and electrically coupled to the package substrate 100 in the bonding process. The conductive structures 201 may include a conductive bump structure (such as a copper or solder bump structure), a conductive pillar structure, or a conductive paste structure. In some embodiments, the semiconductor die may be a system on chip (SOC) die and include a radio frequency (RF) device (not shown) therein.

In the embodiment, the semiconductor package 10 further includes a conductive shielding element 110 disposed on the package substrate 100 and covers the semiconductor die 200. In some embodiments, the conductive shielding element 110 is formed of copper, aluminum or another suitable shielding material to provide EMI protection.

In some embodiments, the conductive shielding element 110 includes a plate portion and sidewall portions surrounding the edges of the plate portion, so that the semiconductor die 200 is inside the space created by the conductive shielding element 110 and the package substrate 100. In some embodiments, the conductive shielding element 110 has an opening 122 formed in one of the sidewall portions thereof. For example, the sidewall portion that extends along the edge 100a' (indicated in FIG. 1C) of the package substrate 100 has an opening 122 (indicated in FIG. 1A). The opening 122 allows one or more devices formed in the semiconductor package 10 to pass through the conductive shielding element 110. For example, an antenna may pass through the conductive shielding element 110 via the opening 122.

In the embodiment, the semiconductor package 10 further includes a 3D antenna 140 disposed on the package substrate 100. The 3D antenna 140 may include a planar structure portion 120 and a bridge structure portion 130. In some embodiments, the planar structure portion 120 is disposed on the package substrate 100 in the second region 100b. Moreover, the bridge structure portion 130 is disposed above the planar structure portion 120 and connected thereto.

In some embodiments, the planar structure portion 120 of the 3D antenna 140 includes a folded pattern 120a and first and second bar patterns 120b and 120c connected thereto, as shown in FIGS. 1A and 1B. In some embodiments, the folded pattern 120a of the planar structure portion 120 is entirely located at the second region 100b of the package substrate 100. Moreover, the first bar pattern 120b and the second bar pattern 120c of the planar structure portion 120 are located at both first and second regions 100a and 100b of the package substrate 100. For example, the first bar pattern 120b is extended from the folded pattern 120a of the planar structure portion 120 and passes through the opening 122 of the conductive shielding element 110, such that the first bar pattern 120b of the planar structure portion 120 has an end 121 in the first region 100a of the package substrate 100. Moreover, the second bar pattern 120c is also extended from the folded pattern 120a of the planar structure portion 120 to the first region 100a of the package substrate 100, such that the second bar pattern 120c of the planar structure portion 120 has an end 121' in the first region 100a of the package substrate 100. In this case, the end 121 of the first bar pattern 120b of the planar structure portion 120 serves as a feeding point of the 3D antenna 140. The second bar pattern 120c is grounded (not shown) via the package substrate 100 and may be parallel to the first bar pattern 120b.

In some embodiments, the bridge structure portion 130 of the 3D antenna 140 is also entirely located at the second region 100b of the package substrate 100 and has an inverted U shape, as shown in FIG. 1A. In this case, the inverted U-shaped bridge structure portion 130 may include a first end that is connected to and above the folded pattern 120a of the planar structure portion 120 and a second end supported by the package substrate 100. Moreover, the inverted U-shaped bridge structure portion 130 may have a lateral extending portion 130a (as indicated in FIG. 1C) that is parallel to the first and second bar patterns 120b and 120c of the planar structure portion 120 and has an end 135 to serve as an open end of the 3D antenna 140.

In the embodiment, since the antenna is integrated in the semiconductor package 10 and disposed on a relatively small region of the package substrate 100 (e.g., the second region 100b), the bridge structure portion 130 allows for the formation of a 3D antenna, so as to increase the effective length of the 3D antenna 140. As a result, a desired operation frequency for the antenna can be obtained.

It should be understood that the shape of the bridge structure and of the planar structure portion of the 3D antenna may be varied by design demands and are not limited to the embodiment shown in FIGS. 1A to 1C.

Figure 2:
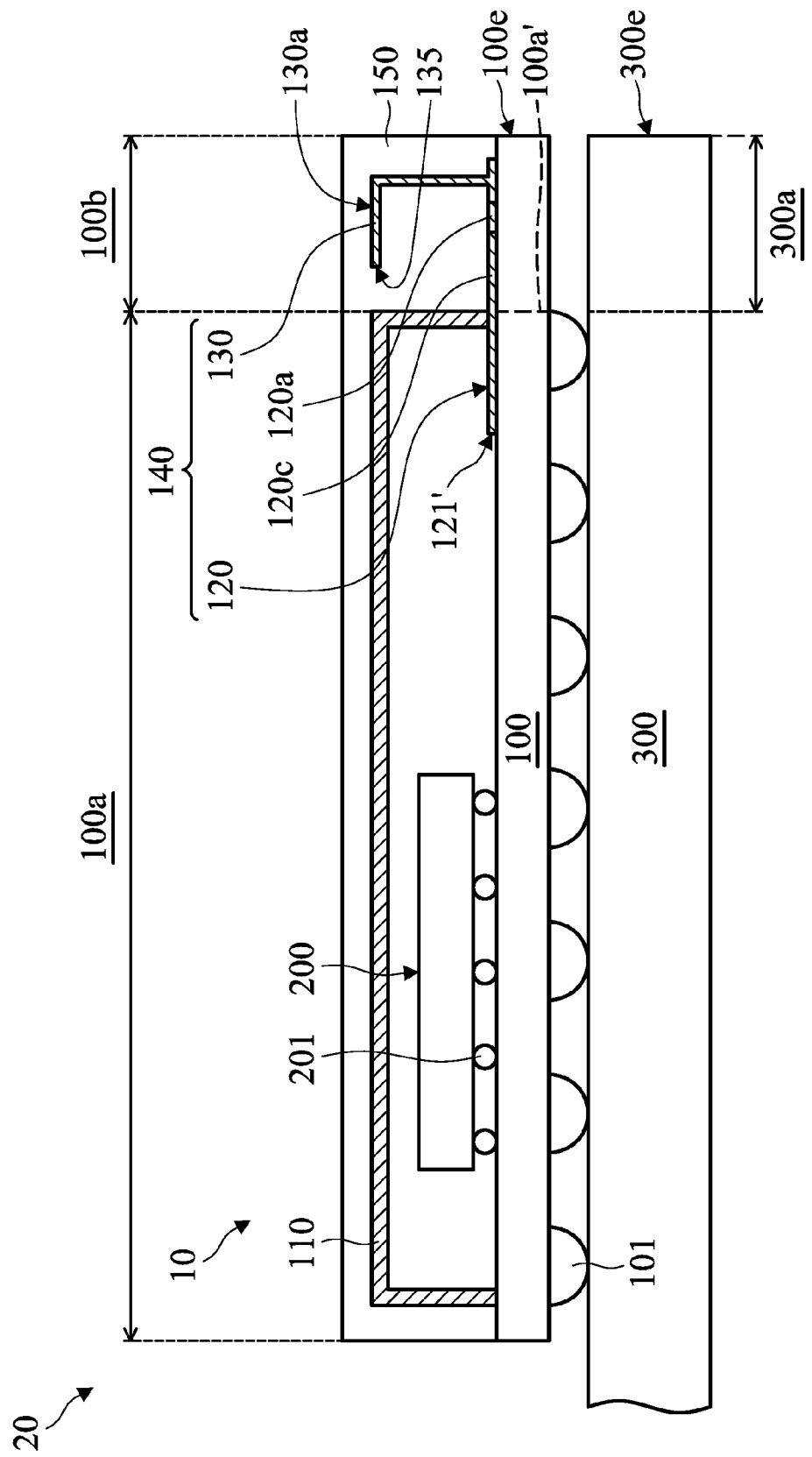
FIG. 2 is a cross-sectional view of an exemplary semiconductor package assembly in accordance with some embodiments of the disclosure.

In the embodiment, the semiconductor package 10 further includes a molding compound 150 disposed on the package substrate 100 and entirely encapsulates the conductive shielding element 110 and the 3D antenna 140 thereon. In some embodiments, the molding compound 150 may be formed of an epoxy, a resin, a moldable polymer, or the like Refer to FIG. 2, which is a cross-sectional view of an exemplary semiconductor package assembly 20 in accordance with some embodiments of the disclosure. Descriptions of elements of the embodiments that are the same as or similar to those previously described with reference to FIGS. 1A to 1C are hereinafter omitted for brevity. In the embodiment, the semiconductor package assembly 20 includes a semiconductor package 10 shown in FIGS. 1A to 1C. Moreover, the semiconductor package 10 is disposed on a circuit board 300 (e.g., a printed circuit board (PCB) that may be formed of polypropylene (PP)). For example, the semiconductor package 10 is mounted on the circuit board 300 by the conductive structures 101 of the package substrate 100 using a bonding process.

In some embodiments, the circuit board 300 (e.g., the PCB) has a keep-out region 300a that is a region free of conductive traces or elements formed therein. Moreover, the semiconductor package 10 is disposed on the circuit board 300 in an arrangement wherein the second region 100b of the package substrate 100 corresponds to the keep-out region 300a of the circuit board 300. Namely, the second region 100b overlaps with the keep-out region 300a. In some embodiments, the keep-out region 300a is located near an edge 300e of the circuit board 300, such that the 3D antenna 140 is disposed near the edge 300e of the circuit board 300.

According to the foregoing embodiments, a conductive shielding element and a 3D antenna are integrated into a semiconductor package for fabricating an antenna in package (AiP). Since the 3D antenna is incorporated into the semiconductor package, the manufacturing cost is reduced and it allows for achieving a small, compact SiP component.

Moreover, the bridge structure portion of the 3D antenna increases its effective length further.

Moreover, since the 3D antenna is embedded in the molding compound, design flexibility for the system integration of the semiconductor package can be increased.

Additionally, the conductive shielding element provides an EMI protection for the semiconductor package and prevents signal coupling between the antenna and semiconductor die that is inside the conductive shielding element.

Figure 3A:
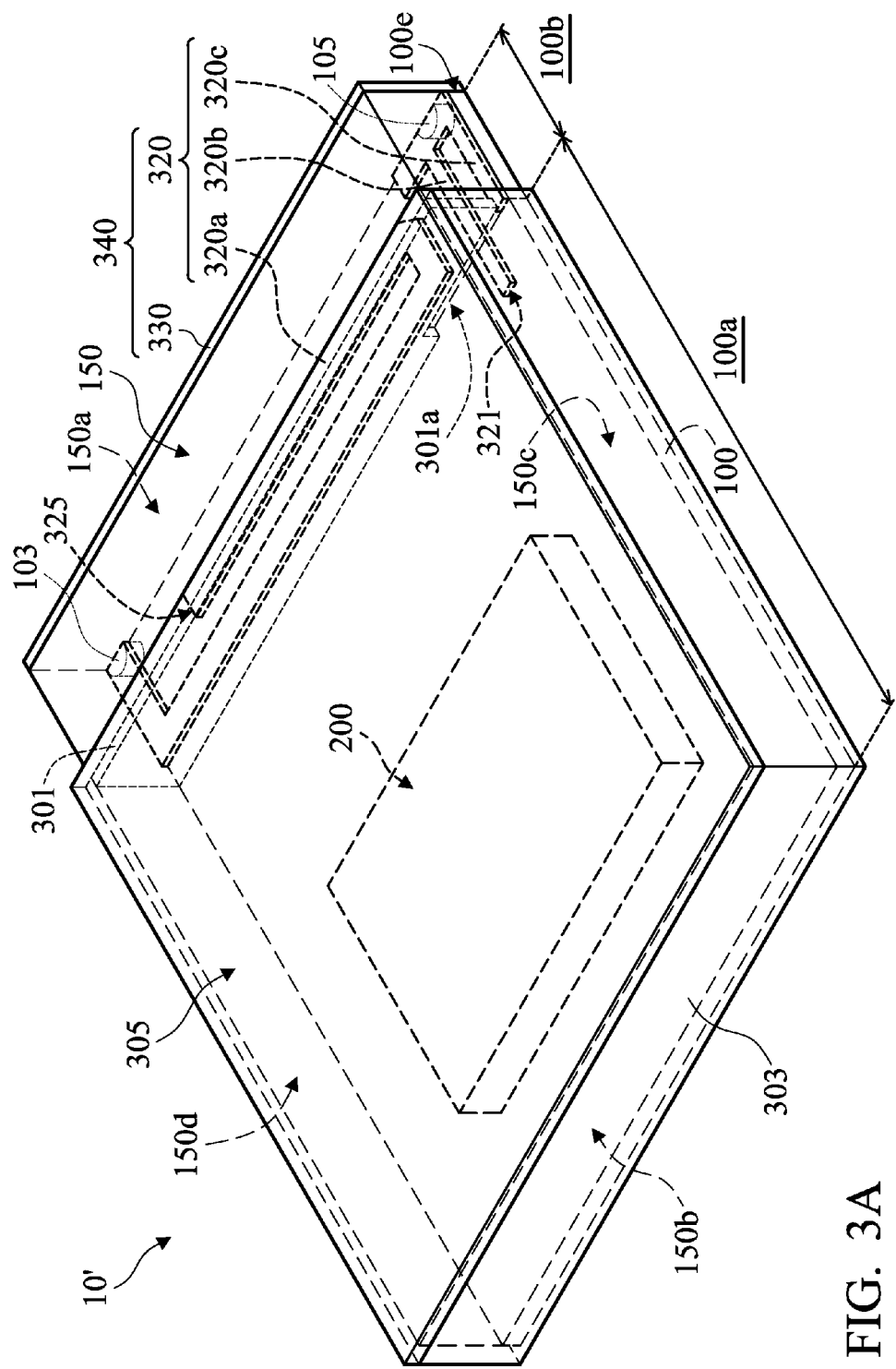
FIG. 3A is a perspective view of an exemplary semiconductor package in accordance with some embodiments of the disclosure.
Figure 3B:
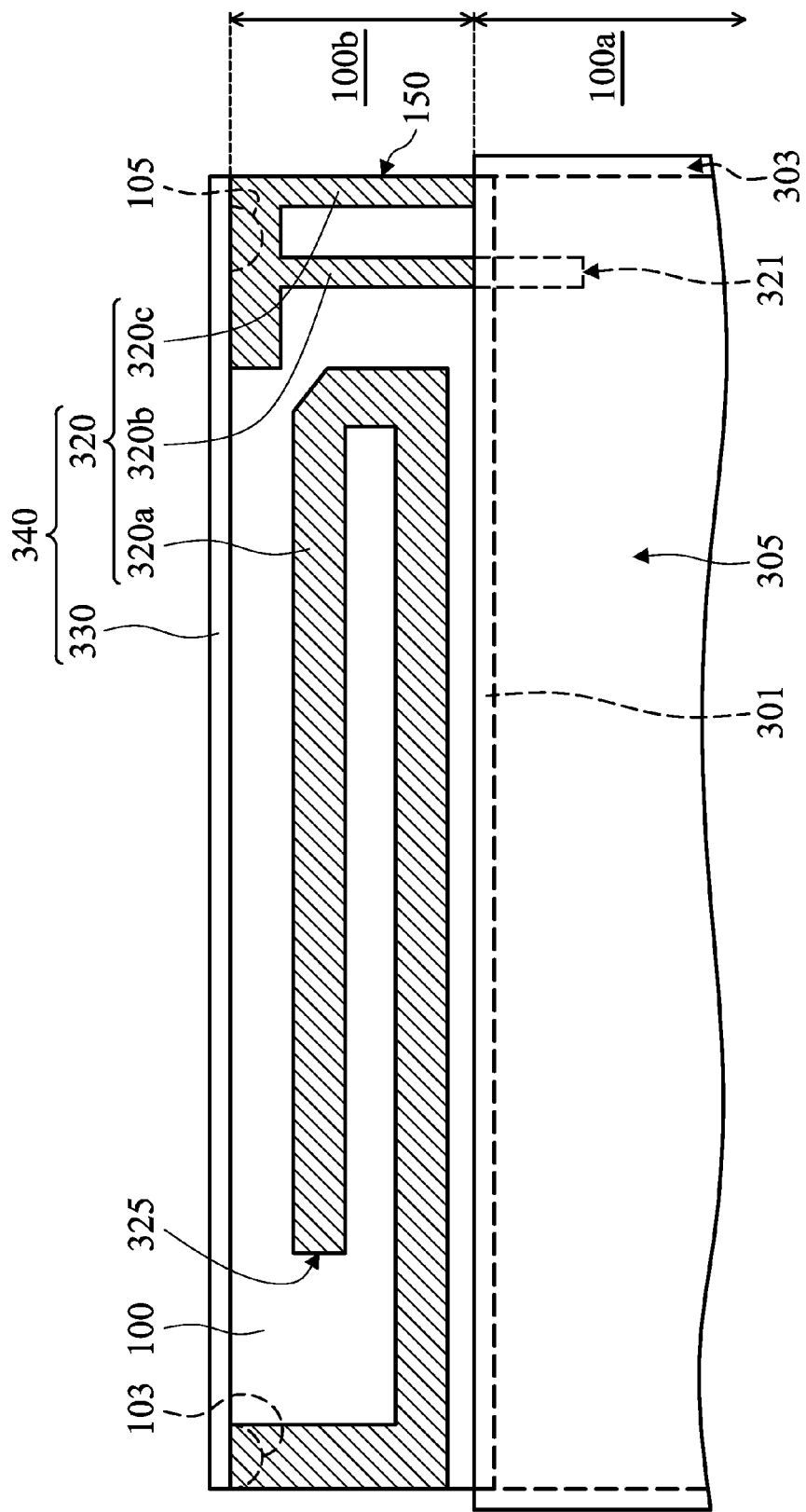
FIG. 3B is a partial plan view of the exemplary semiconductor package shown in FIG. 3A.
Figure 3C:
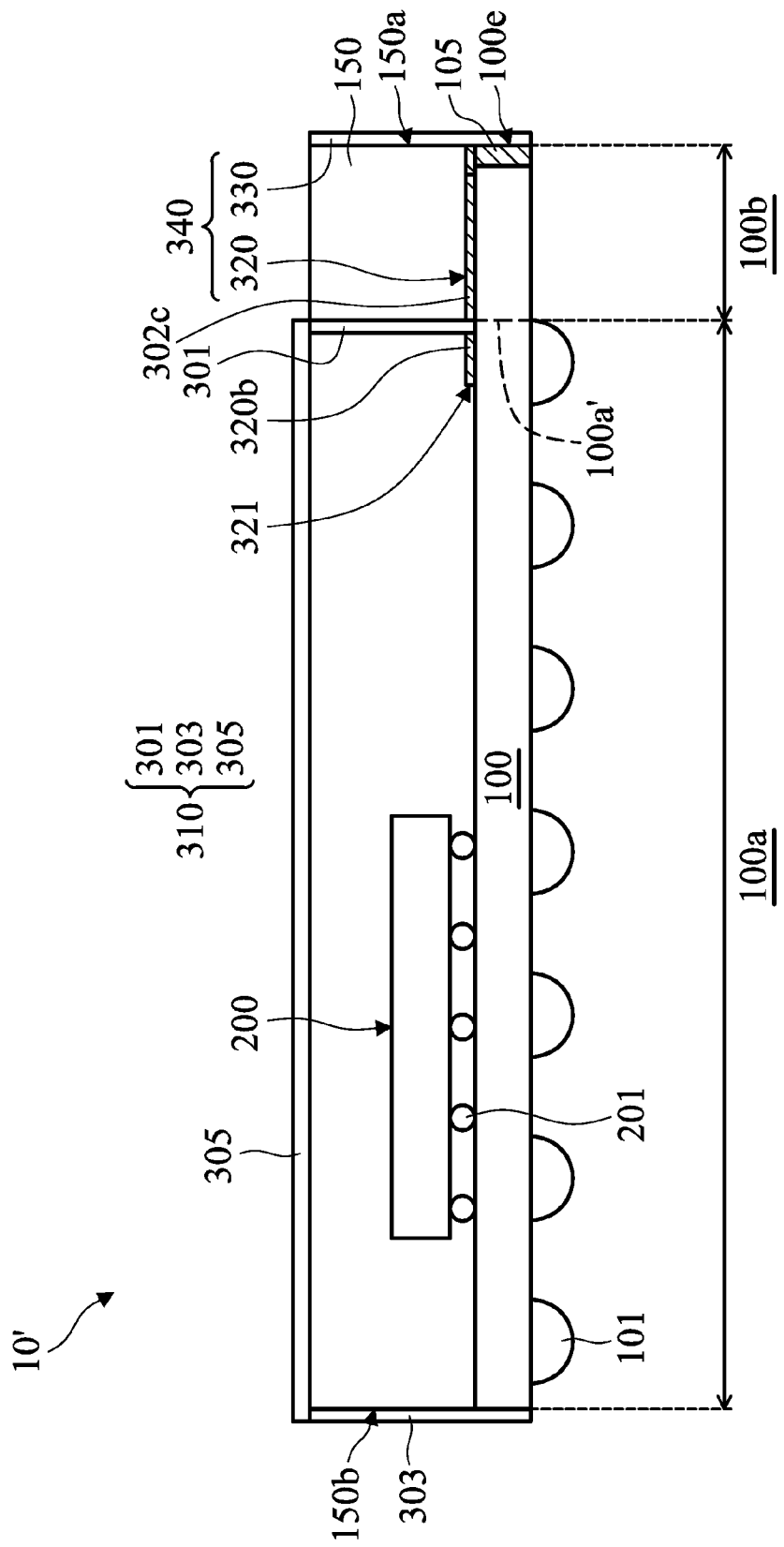
FIG. 3C is a cross-sectional view of an exemplary semiconductor package shown in FIG. 3A.

Refer to FIGS. 3A to 3C, in which FIG. 3A is a perspective view of a semiconductor package 10' in accordance with some embodiments of the disclosure, FIG. 3B is a partial plan view of the exemplary semiconductor package shown in FIG. 3A, and FIG. 3C is a cross-sectional view of an exemplary semiconductor package shown in FIG. 3A. Descriptions of elements of the embodiments hereinafter that are the same as or similar to those previously described with reference to FIGS. 1A to 1C are omitted for brevity. In the embodiment, the semiconductor package 10' has a structure that is similar to that of the semiconductor package 10 shown in FIGS. 1A to 1C except for the structure and the arrangement of the conductive shielding element and the 3D antenna.

In the embodiment, the semiconductor package 10' includes a molding compound 150 disposed on a package substrate 100 in the first and second regions 100a and 100b. Moreover, a semiconductor die 200 disposed on the package substrate 100 in the first region 100a and inside the molding compound 150.

In the embodiment, the semiconductor package 10' further includes a 3D antenna 340 disposed on the package substrate 100. The 3D antenna 340 includes a planar structure portion 320 and a wall structure portion 330 contacting the planar structure portion 320. In some embodiments, the planar structure portion 320 is disposed on the package substrate 100 in the second region 100b. Moreover, the wall structure portion 330 covers one or more sidewalls 150a, 150c, and 150d of the molding compound 150 in the second region 100b (e.g., the sidewall 150a indicated in FIGS. 3A and 3C that is near the edge 100e of the package substrate 100). In some embodiments, the wall structure portion 330 may cover the top surface of the molding compound 150 in the second region 100b.

In some embodiments, the planar structure portion 320 of the 3D antenna 140 includes a spiral pattern 320a and two bar patterns 320b and 320c separated therefrom, as shown in FIGS. 3A and 3B. In some embodiments, the spiral pattern 320a of the planar structure portion 320 is entirely located at the second region 100b of the package substrate 100 and has an end 325 to serve as an open end of the 3D antenna 340.

In some embodiments, the bar pattern 320b of the planar structure portion 120 is T-shaped and located at both first and second regions 100a and 100b of the package substrate 100. For example, the bar pattern 320b (e.g., T-bar pattern) has a stem portion extending from the second region 100b of the package substrate 100 to the first region 100a thereof. The stem portion of the bar pattern 320b has an end 321 in the first region 100a of the package substrate 100. In this case, the end 321 of the bar pattern 320b of the planar structure portion 320 serves as a feeding point of the 3D antenna 340. Moreover, the bar pattern 320b (e.g., T-bar pattern) has an arm portion. The bar pattern 320c is extended from the arm portion of the bar pattern 320b and may be parallel to the stem portion of the bar pattern 320b. In this case, the bar pattern 320c is located at second region 100b of the package substrate 100 and may be grounded (not shown) via the package substrate 100.

In some embodiments, the 3D antenna 340 may further include first and second conductive vias 103 and 105 (indicated in FIGS. 3A and 3C) that are disposed in the package substrate 100 in the second region 100b and electrically connected to the spiral pattern 320a and the bar pattern 320b, respectively. In this case, each of the first and second conductive vias 103 and 105 has a sidewall level with the edge 100e of the package substrate 100, such that the sidewalls of the first and second conductive vias 103 and 105 are exposed from the edge 100e of the package substrate 100.

Moreover, the wall structure portion 330 of the 3D antenna 340 may further cover the sidewall of the package substrate 100 that is at the edge 100e of the package substrate 100, so that the exposed sidewalls of the first and second conductive vias 103 and 105 contact the wall structure portion 330 of the 3D antenna 340. As a result, the first conductive via 103 is electrically connected between the spiral pattern 320a and the wall structure portion 330 and the second conductive via 105 is electrically connected between the bar pattern 320b and the wall structure portion 330.

Similarly, in the embodiment, the wall structure portion 330 allows for the formation of a 3D antenna, so as to increase the effective length. As a result, a desired operation frequency for the antenna can be obtained.

It should be understood that the shape of the planar structure portion of the 3D antenna may be varied by design demands and is not limited to the embodiment shown in FIGS. 3A to 3C.

In the embodiment, the semiconductor package 10' further includes a conductive shielding element 310 disposed on the package substrate 100 to cover the semiconductor die 200. In some embodiments, the conductive shielding element 310 is formed of copper, aluminum or another suitable shielding material to provide an EMI protection. In some embodiments, the conductive shielding element 310 may be formed of a material that is the same as that of the wall structure portion 330 of the 3D antenna 340.

In the embodiment, the conductive shielding element 310 includes a spacer portion 301, a U-shaped wall portion 303, and a plate portion 305. In some embodiments, the spacer portion 301 of the conductive shielding element 310 is disposed on the package substrate 100 and extends along the edge 100a' (indicated in FIG. 3C) of the package substrate 100. Moreover, the spacer portion 301 of the conductive shielding element 310 is disposed between the 3D antenna 340 and the semiconductor die 200 and passes through the molding compound 105, such that the top surface of the spacer portion 301 is exposed from the molding compound 105. In some embodiments, sidewalls of the spacer portion 301 may also be exposed from the sidewalls 105c and 105d (indicated in FIG. 3A) of the molding compound 105. In some embodiments, the spacer portion 301 of the conductive shielding element 310 has an opening 301a formed therein. The opening 301a allows one or more devices formed in the semiconductor package 10 to pass through the conductive shielding element 110. For example, the bar pattern 320b of the planar structure portion 320 of the 3D antenna 340 may pass through the spacer portion 301 of the conductive shielding element 110 via the opening 301a.

In some embodiments, the U-shaped wall portion 303 covers the sidewalls 150b, 150c, and 150d of the molding compound 150 in the first region 100a and is separated from the wall structure portion 330 of the 3D antenna 340. Namely, portions of the sidewalls 150c and 150d may be exposed from the U-shaped wall portion 303.

In some embodiments, the plate portion 305 partially covers a top surface of the molding compound 105 in the first region 100a, so that the plate portion 305 is connected to the exposed top surface of the spacer portion 301. Similarly, the plate portion 305 is separated from the wall structure portion 330 of the 3D antenna 340. Namely, a portion of the top surface of the molding compound 105 may be exposed from the plate portion 305.

Figure 4:
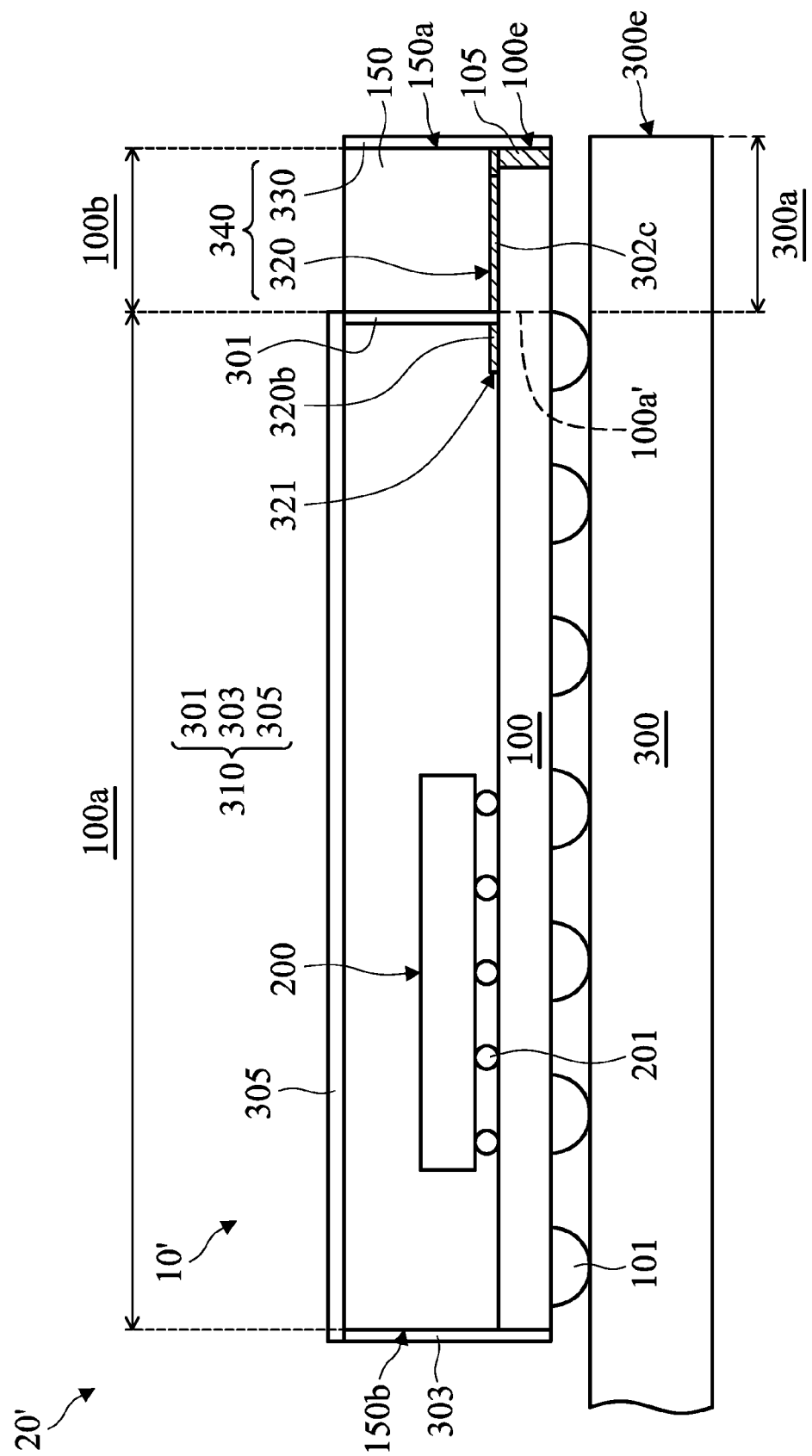
FIG. 4 is a cross-sectional view of an exemplary semiconductor package assembly in accordance with some embodiments of the disclosure.

Refer to FIG. 4, a cross-sectional view of an exemplary semiconductor package assembly 20' in accordance with some embodiments of the disclosure. Descriptions of elements of the embodiments hereinafter that are the same as or similar to those previously described with reference to FIGS. 2 and 3A to 3C are omitted for brevity. In the embodiment, the semiconductor package assembly 20' includes a semiconductor package 10' shown in FIGS. 3A to 3C. Moreover, the semiconductor package 10' is disposed on a circuit board 300. For example, the semiconductor package 10' is mounted on the circuit board 300 by the conductive structures 101 of the package substrate 100 using a bonding process.

In some embodiments, the semiconductor package 10' is disposed on the circuit board 300 in an arrangement wherein the second region 100b of the package substrate 100 corresponds to the keep-out region 300a of the circuit board 300. Namely, the second region 100b overlaps with the keep-out region 300a. In some embodiments, the keep-out region 300a is located near an edge 300e of the circuit board 300, such that the 3D antenna 340 is disposed near the edge 300e of the circuit board 300.

According to the foregoing embodiments, a conductive shielding element and a 3D antenna are integrated into a semiconductor package for fabricating an antenna in package (AiP). Since the 3D antenna is incorporated into the semiconductor package, the manufacturing cost is reduced and it allows for achieving a small, compact SiP component.

Moreover, the wall structure portion of the 3D antenna increases its effective length. As a result, a desired operation frequency for the antenna can be obtained.

Moreover, since the 3D antenna is integrated in the semiconductor package, design flexibility for the system integration of the semiconductor package can be increased.

Additionally, the conductive shielding element provides EMI protection for the semiconductor package and prevents signal coupling between the antenna and semiconductor die that is inside the conductive shielding element.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   a package substrate having a first region and a second region defined between an edge of the package substrate and an edge of the first region;
   a semiconductor die disposed on the package substrate in the first region;
   a conductive shielding element disposed on the package substrate and covering the semiconductor die; and
   a three-dimensional (3D) antenna, comprising:
   a planar structure portion disposed on the package substrate in the second region; and
   a bridge structure portion above the planar structure portion and connected thereto,
   wherein the first bar pattern has an end in the first region to serve as a feeding point of the 3D antenna, and
   wherein the conductive shielding element has an opening formed in a sidewall thereof, such that the first bar pattern passes through the conductive shielding element via the opening.

2. The semiconductor package as claimed in claim 1, wherein the planar structure portion of the 3D antenna comprises a folded pattern and first and second bar patterns connected thereto.

3. The semiconductor package as claimed in claim 2, wherein the second bar pattern is parallel to the first bar pattern and grounded via the package substrate.

4. The semiconductor package as claimed in claim 1, wherein the bridge structure of the 3D antenna has an end to serve as an open end of the 3D antenna.

5. A semiconductor package, comprising:
a package substrate having a first region and a second region defined between an edge of the package substrate and an edge of the first region;
a molding compound disposed on the package substrate in the first and second regions;
a semiconductor die disposed on the package substrate in the first region and inside the molding compound;
a three-dimensional (3D) antenna, comprising:
a planar structure portion on the package substrate in the second region; and
a wall structure portion contacting the planar structure portion and covering a top surface or one of sidewalls of the molding compound in the second region; and
a conductive shielding element disposed on the package substrate to cover the semiconductor die,
wherein the bar pattern has one end in the first region to serve as a feeding point of the 3D antenna,
wherein a spacer portion of the conductive shielding element has an opening formed in a sidewall thereof, such that the bar pattern passes through the spacer portion via the opening.

6. The semiconductor package as claimed in claim 5, wherein the planar structure portion of the 3D antenna comprises a spiral pattern and a bar pattern separated therefrom.

7. The semiconductor package as claimed in claim 6, wherein the spiral pattern has an end to serve as an open end of the 3D antenna.

8. The semiconductor package as claimed in claim 6, wherein the 3D antenna further comprises first and second conductive vias that are disposed in the package substrate in the second region and exposed from the edge of the package substrate.

9. The semiconductor package as claimed in claim 8, wherein the first conductive via is electrically connected between the spiral pattern and the wall structure portion and the second conductive via is electrically connected between the bar pattern and the wall structure portion.

10. The semiconductor package as claimed in claim 5, wherein the conductive shielding element further comprises a plate portion covering a top surface of the molding compound in the first region, connected to the spacer portion, and separated from the wall structure portion of the 3D antenna.

11. A semiconductor package assembly, comprising:
a printed circuit board (PCB) having a keep-out region;
a package substrate disposed on the PCB, wherein the package substrate has a first region and a second region defined between an edge of the package substrate and an edge of the first region and corresponding to the keep-out region;
a semiconductor die disposed on the package substrate in the first region;
a conductive shielding element disposed on the package substrate and covering the semiconductor die;
a three-dimensional (3D) antenna, comprising:
a planar structure portion disposed on the package substrate in the second region; and
a bridge structure portion above the planar structure portion and connected thereto; and
a molding compound encapsulating the conductive shielding element and the 3D antenna,
wherein the first bar pattern has an end in the first region to serve as a feeding point of the 3D antenna and the second bar pattern is parallel to the first bar pattern and grounded via the package substrate,
wherein the conductive shielding element has an opening formed in a sidewall thereof, such that the first bar pattern passes through the conductive shielding element via the opening.

12. The semiconductor package assembly as claimed in claim 11, wherein the planar structure portion of the 3D antenna comprises a folded pattern and first and second bar patterns connected thereto.

13. The semiconductor package assembly as claimed in claim 11, wherein the keep-out region is located near an edge of the PCB.

14. A semiconductor package assembly, comprising:
a printed circuit board (PCB) having a keep-out region;
a package substrate disposed on the PCB, wherein the package substrate has a first region and a second region defined between an edge of the package substrate and an edge of the first region and corresponding to the keep-out region;
a molding compound disposed on the package substrate in the first and second regions;
a semiconductor die disposed on the package substrate in the first region and inside the molding compound;
a three-dimensional (3D) antenna, comprising:
a planar structure portion on the package substrate in the second region; and
a wall structure portion contacting the planar structure portion and covering a top surface or one of sidewalls of the molding compound in the second region; and
a conductive shielding element disposed on the package substrate to cover the semiconductor die,
wherein the bar pattern has one end in the first region to serve as a feeding point of the 3D antenna and the spiral pattern has an end to serve as an open end of the 3D antenna,
wherein a spacer portion of the conductive shielding element has an opening formed in a sidewall thereof, such that the bar pattern passes through the spacer portion via the opening.

15. The semiconductor package assembly as claimed in claim 14, wherein the planar structure portion of the 3D antenna comprises a spiral pattern and a bar pattern separated therefrom.

16. The semiconductor package assembly as claimed in claim 15, wherein the 3D antenna further comprises first and second conductive vias that are disposed in the package substrate in the second region and exposed from the edge of the package substrate, and wherein the first conductive via is electrically connected between the spiral pattern and the wall structure portion and the second conductive via is electrically connected between the bar pattern and the wall structure portion.

17. The semiconductor package assembly as claimed in claim 14, wherein the conductive shielding element further comprises a plate portion covering a top surface of the molding compound in the first region, connected to the spacer portion, and separated from the wall structure portion of the 3D antenna.

18. The semiconductor package assembly as claimed in claim 14, wherein the keep-out region is located near an edge of the PCB.

\* \* \* \* \*